(12) United States Patent
Kobayakawa

(10) Patent No.: US 9,312,462 B2
(45) Date of Patent: *Apr. 12, 2016

(54) LED MODULE

(71) Applicant: ROHM CO., LTD., Kyoto-shi, Kyoto (JP)

(72) Inventor: Masahiko Kobayakawa, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/531,420

(22) Filed: Nov. 3, 2014

(65) Prior Publication Data

US 2015/0048412 A1   Feb. 19, 2015

Related U.S. Application Data

(63) Continuation of application No. 13/695,206, filed as application No. PCT/JP2011/060436 on Apr. 28, 2011, now Pat. No. 8,890,203.

(30) Foreign Application Priority Data

Apr. 30, 2010   (JP) ................... 2010-104768

(51) Int. Cl.
  *H01L 33/00* (2010.01)
  *H01L 33/62* (2010.01)
  *H01L 33/64* (2010.01)

(52) U.S. Cl.
  CPC .............. *H01L 33/62* (2013.01); *H01L 33/647* (2013.01); *H01L 2224/45144* (2013.01); *H01L 2224/48465* (2013.01); *H01L 2224/73265* (2013.01); *H01L 2924/01322* (2013.01)

(58) Field of Classification Search
  CPC .................. H01L 33/62; H01L 33/647; H01L 2224/48465; H01L 2224/73265; H01L 2224/45144; H01L 2924/01322

USPC ........ 257/98, 99, E33.057, E33.066, E33.072
See application file for complete search history.

(56) References Cited

U.S. PATENT DOCUMENTS 5,668,386 A * 9/1997 Makiuchi et al. ............. 257/184
5,907,151 A * 5/1999 Gramann et al. .......... 250/214.1
(Continued)

FOREIGN PATENT DOCUMENTS

JP   5-90967   12/1993
JP   7-86640   3/1995
(Continued)

OTHER PUBLICATIONS

Machine translation, Japanese Pat. Pub. No. H5-90967, translation date: Jul. 23, 2015 (Espacenet), all pages.*
(Continued)

*Primary Examiner* — Victoria K Hall
(74) *Attorney, Agent, or Firm* — Hamre, Schumann, Mueller & Larson, P.C.

(57) ABSTRACT

A lead 1 includes a die-bonding portion 11 with an opening 11a penetrating in a thickness direction. Another lead 2 is spaced from the lead 1. An LED unit 3 includes an LED chip 30 with a electrode terminal 31 connected to the lead 1 and another electrode terminal 32 connected to the lead 2. The LED unit 3, mounted on a surface of the die-bonding portion 11 on a first side in z direction, overlaps the opening 11a. A wire 52 connects the lead 2 and the electrode terminal 32. A support member 4 supporting the leads 1-2 is held in contact with another surface of the die-bonding portion 11 on a second side in z direction. These arrangements ensure efficient heat dissipation from the LED chip 30 and efficient use of light emitted from the LED chip 3.

11 Claims, 6 Drawing Sheets

(56) References Cited

U.S. PATENT DOCUMENTS

| | | | |
|---|---|---|---|
| 5,990,498 A * | 11/1999 | Chapnik et al. | 257/99 |
| 6,680,568 B2 | 1/2004 | Fujiwara et al. | |
| 6,858,880 B2 | 2/2005 | Horiuchi et al. | |
| 7,030,423 B2 | 4/2006 | Chang et al. | |
| 7,521,782 B2 | 4/2009 | Ishii | |
| 7,795,053 B2 * | 9/2010 | Ohno et al. | 438/26 |
| 7,828,993 B2 | 11/2010 | Roth et al. | |
| 7,872,277 B2 | 1/2011 | Hsu et al. | |
| 8,030,839 B2 | 10/2011 | Hosokawa et al. | |
| 8,283,675 B2 * | 10/2012 | Ohta et al. | 257/79 |
| 8,525,213 B2 | 9/2013 | Park et al. | |
| 8,685,766 B2 | 4/2014 | Suehiro et al. | |
| 8,890,203 B2 * | 11/2014 | Kobayakawa | 257/99 |
| 9,184,149 B2 * | 11/2015 | Ng | H01L 24/48 |
| 2001/0022390 A1 * | 9/2001 | Waitl et al. | 257/666 |
| 2004/0188700 A1 * | 9/2004 | Fukasawa et al. | 257/100 |
| 2007/0080357 A1 * | 4/2007 | Ishii | 257/98 |
| 2007/0085102 A1 * | 4/2007 | Orita | 257/98 |
| 2007/0284708 A1 | 12/2007 | Hanya | |
| 2008/0002100 A1 * | 1/2008 | Kaneko et al. | 349/65 |
| 2008/0093962 A1 | 4/2008 | Kim et al. | |
| 2008/0128724 A1 | 6/2008 | Isobe et al. | |
| 2009/0294793 A1 * | 12/2009 | Kim et al. | 257/99 |
| 2009/0315056 A1 * | 12/2009 | Kim | 257/98 |
| 2010/0123154 A1 * | 5/2010 | Lee | 257/98 |
| 2011/0248237 A1 | 10/2011 | Choi et al. | |
| 2014/0159093 A1 | 6/2014 | Kraeuter | |

FOREIGN PATENT DOCUMENTS

| | | | | |
|---|---|---|---|---|
| JP | 8-204239 | | 8/1996 | |
| JP | 11-112021 | | 4/1999 | |
| JP | 11-112025 | | 4/1999 | |
| JP | 2001-7405 | | 1/2001 | |
| JP | 2001-223388 | | 8/2001 | |
| JP | 2002-314144 | | 10/2002 | |
| JP | 2003-158301 | | 5/2003 | |
| JP | 2004-79619 | | 3/2004 | |
| JP | 2004-214338 | | 7/2004 | |
| JP | 2005-159296 | | 6/2005 | |
| JP | 2006-54209 | | 2/2006 | |
| JP | 2007-35794 | * | 2/2007 | H01L 33/00 |
| JP | 2007-297643 | | 11/2007 | |
| JP | 2007-12993 | | 1/2008 | |
| JP | 2008-66691 | | 3/2008 | |
| JP | 2009-032850 | | 2/2009 | |
| JP | 2009-33081 | | 2/2009 | |
| WO | WO 00/79605 | | 12/2000 | |
| WO | WO 2009/051093 | | 4/2009 | |

OTHER PUBLICATIONS

Machine translation, Ishinaga, Japanese Pat. Pub. No. H8-204239, translation date: Jul. 23, 2015 (Espacenet), all pages.*

Machine translation, Iwasaki, JP 2007-35794, translation date: Sep. 26, 2014, JPO and Japio, all pages.

* cited by examiner

FIG. 12 - Prior Art

LED MODULE

This application is a Continuation of U.S. Ser. No. 13/695,206 filed Oct. 29, 2012, which is a National Stage Application of PCT/JP2011/060436, filed Apr. 28, 2011, which applications are incorporated herein by reference.

TECHNICAL FIELD

The present invention relates to an LED module incorporating an LED chip.

BACKGROUND ART

FIG. 12 shows an example of conventional LED module (see Patent Document 1, for example). In the LED module X shown in FIG. 12, an LED unit 92 is mounted at the center on an obverse surface of a substrate 91 by using a bonding material, not shown. The substrate 91 is an insulating substrate made of a ceramic material such as alumina or alumina nitride. The LED unit 92 is connected to leads 94 and 95 by wires 93. The LED module X further includes a resin cover 96 made of a transparent epoxy resin and covering the LED unit 92 and the wires 93. For instance, the LED unit 92 is made transparent.

In the LED module X, the obverse surface of the substrate 91 is made white so that light traveling through the reverse surface of the LED unit 92 toward the obverse surface of the substrate 91 is reflected. This assures that light emitted from the LED unit 92 is efficiently utilized.

However, when the LED unit 92 is directly mounted on the substrate 91, heat generated during light emission of the LED unit 92 is not easily dissipated as compared with the case where the LED unit 92 is mounted on a wiring pattern made of a metal, for example. On the other hand, although a wiring pattern made of a metal is an excellent heat dissipator, its surface may change to a dark color as time elapses. Such color change hinders efficient
utilization of light from the LED unit 92.

TECHNICAL REFERENCE

Patent Document

Patent Document 1: JP-A-11-112025

SUMMARY OF THE INVENTION

Problems to be Solved by the Invention

The present invention has been conceived under the circumstances described above. It is therefore an object of the present invention to provide an LED module that can efficiently dissipate heat from the LED chip incorporated in it and efficiently utilize light emitted from the LED chip.

Means for Solving the Problems

According to a first aspect of the present invention, there is provided an LED module comprising: a first lead including a die-bonding portion formed with an opening penetrating in a thickness direction; a second lead spaced apart from the first lead; an LED unit including an LED chip provided with a first electrode terminal and a second electrode terminal, the first electrode terminal being electrically connected to the first lead, the second electrode terminal being electrically connected to the second lead, the LED unit being mounted on a surface of the die-bonding portion on a first side in the thickness direction in a manner overlapping the opening at least partially; a wire connecting the second lead and the second electrode terminal to each other; and a support member supporting the first and the second leads and held in contact with a surface of the die-bonding portion on a second side in the thickness direction.

According to this arrangement, heat generated during light emission of the light-emitting element is readily transferred to the die-bonding portion and released to the outside through the first lead. Further, part of the light emitted from the light-emitting element toward the die-bonding portion side in the thickness direction is reflected by the white support member filling the opening. Thus, the light-emitting element module of the present invention exhibits both high heat dissipation and high brightness.

According to a second aspect of the present invention, in the LED module of the first aspect, at least part of the opening overlaps a part of the LED chip as viewed in the thickness direction.

According to a third aspect of the present invention, in the LED module of the first or second aspect, the support member is made of a white resin.

According to a fourth aspect of the present invention, in the LED module of the third aspect, the opening is filled with a part of the support member.

According to a fifth aspect of the present invention, in the LED module of any one of the second through the fourth aspects, the opening is smaller than the LED chip as viewed in the thickness direction, and the entirety of the opening is included in the LED chip.

According to a sixth aspect of the present invention, in the LED module of any one of the second through the fourth aspects, the opening includes a portion that does not overlap the LED chip as viewed in the thickness direction.

According to a seventh aspect of the present invention, in the LED module of the sixth aspect, the first and the second electrode terminals are provided on an end surface of the LED chip disposed on the first side in the thickness direction, and the opening includes an edge disposed on a side in a direction perpendicular to a direction in which the wire extends, where the edge of the opening is arranged not to overlap the LED chip as viewed in the thickness direction.

According to an eighth aspect of the present invention, in the LED module of the fifth or sixth aspect, the second electrode terminal is provided on a first end surface of the LED chip in the thickness direction, and the first electrode terminal is provided on a second end surface of the LED chip in the thickness direction.

Other features and advantages of the present invention will become more apparent from detailed description given below with reference to the accompanying drawings.

BRIEF DESCRIPTION OF THE DRAWINGS

FIG. 12 is a perspective view showing a conventional LED module.

MODE FOR CARRYING OUT THE INVENTION

Preferred embodiments of the present invention are described below with reference to the accompanying drawings.

Figure 1:
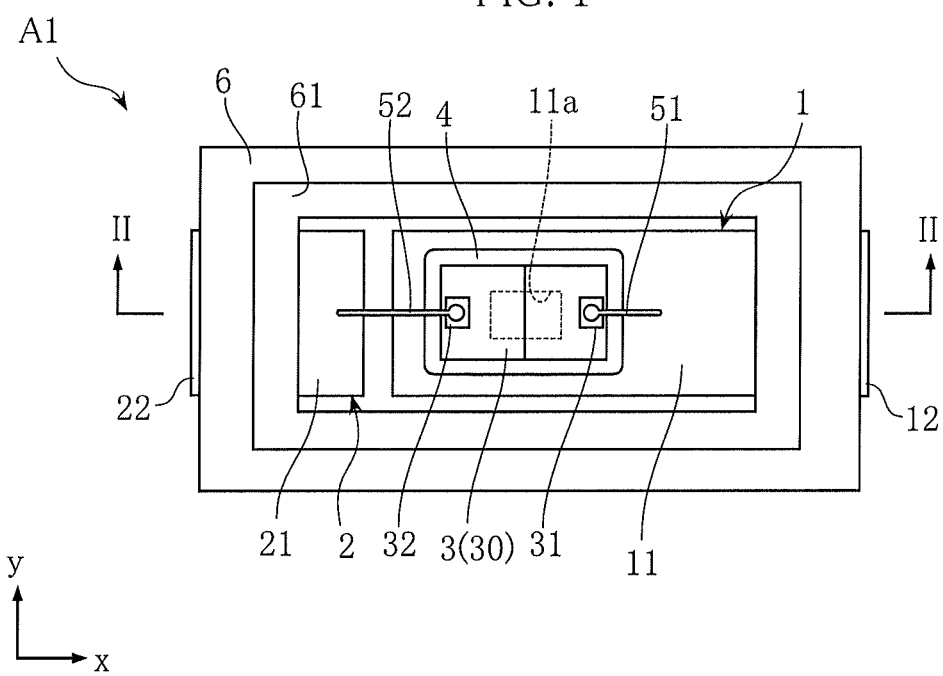
FIG. 1 is a plan view showing an LED module according to a first embodiment of the present invention.
Figure 2:
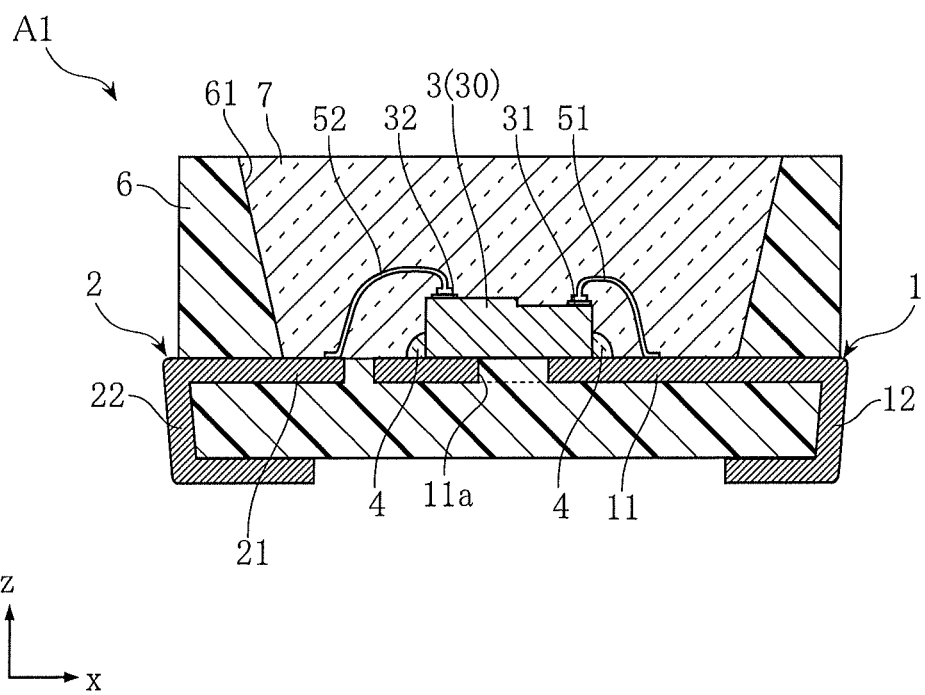
FIG. 2 is a sectional view taken along lines II-II in FIG. 1.

FIGS. 1 and 2 show an LED module according to a first embodiment of the present invention. The LED module A1 of this embodiment includes a lead 1, a lead 2 spaced apart from the lead 1, and an LED unit 3 electrically connected to each of the leads 1 and 2, and is designed such that the LED chip 3 emits light due to connection of the leads 1 and 2 to an external electric circuit. The LED unit 3 is connected to the lead 1 by a wire 51 and connected to the lead 2 by a wire 52. The LED module A1 further includes a support member 6 for fixing the leads 1 and 2, and a protective member 7 for protecting the LED unit 3. In FIG. 1, illustration of the protective member 7 is omitted. The LED module A1 is in the form of an elongated rectangle with a longer side extending in the x direction and a shorter side extending in the y direction, as viewed in the z direction.

The lead 1 includes a die-bonding portion 11 having an opening 11a, and a terminal portion 12 extending from the die-bonding portion 11. The lead 1 is made by punching a copper plate which is 0.15 to 0.20 mm in thickness to form an opening 11a, and then plating the surface with silver.

The die-bonding portion 11 is a portion for mounting the LED unit 3. The opening 11a is provided adjacent to the center of the die-bonding portion 11 in the y direction. The position, shape and size of the opening 11a can be set appropriately in the punching process. The opening 11a in this embodiment is in the form of a rectangle having a dimension of 0.3 mm in the x direction and a dimension of 0.2 mm in the y direction. As shown in FIG. 2, the opening 11a is filled with the support member 6.

The terminal portion 12 is exposed to the outside from one end of the support member 6 in the x direction and is used to connect the lead 1 to an external electric circuit. The terminal portion 12 is formed by bending a portion of the lead 1 which projects from the support member 6 after the support member 6 is formed.

As shown in FIGS. 1 and 2, the lead 2 includes a wire-bonding port ion 21 spaced apart from the die-bonding portion 11 in the x direction, and a terminal portion 22 extending from the wire-bonding portion 21. The lead 2 is formed by e.g. plating a copper plate which is 0.15 to 0.20 mm in thickness with silver. The terminal portion 22 is exposed to the outside from another end of the support member 6 in the x direction and is used to connect the lead 2 to an external electric circuit. The terminal portion 22 is formed by bending a portion of the lead 2 which projects from the support member 6 after the support member 6 is formed.

The LED unit 3 comprises an LED chip 30 made by forming a layer of a semiconductor material such as gallium nitride on a surface of a substrate made of e.g. sapphire (Al2O3 single crystal). The LED chip 30 emits blue light, green light, red light or the like due to recombination of electrons and holes in an active layer sandwiched between an n-type semiconductor layer and a p-type semiconductor layer. Since the light emitted is hardly absorbed by the sapphire substrate in the LED unit 3, the light is emitted in almost all directions. As viewed in the z direction, the LED unit 3 is in the form of an elongated rectangle having a dimension of 0.8 mm in the x direction and a dimension of 0.4 mm in the y direction. As shown in FIG. 1, the LED unit 3 is bonded to the die-bonding portion 11 by using a bonding material 4 so as to overlap the opening 11a as viewed in the z direction. In this embodiment, the LED unit 3 is arranged to close the opening 11a. The bonding material 4 is e.g. a transparent epoxy resin.

To fix the LED unit 3 to the die-bonding portion 11, a bonding material 4 is first applied to a region of the die-bonding portion 11 on which the LED unit 3 is to be mounted, and then the LED unit 3 is placed on the bonding material 4.

The LED unit 3 has, on the upper end surface in the z direction, an electrode terminal 31 at one end in the x direction and an electrode terminal 32 at another end in the x direction. The electrode terminal 31 is connected to an n-type semiconductor layer and electrically connected to the die-bonding portion 11 via a wire 51. The electrode terminal 32 is connected to a p-type semiconductor layer and electrically connected to the wire-bonding portion 21 via a wire 52. The wires 51 and 52 may be gold wires.

The support member 6 is made of a white epoxy resin in which e.g. titanium oxide is mixed and has a generally rectangular shape in plan view, as shown in FIG. 1. The support member 6 fixes the leads 1 and 2 by covering part of each lead. The support member 6 is recessed at the center and has a reflective surface 61 that is inclined to become further away from the LED unit 3 in the x direction as proceeding upward in the z direction. As shown in FIG. 1, the reflective surface 61 is in the form of a frame surrounding the LED unit 3, as viewed in the z direction. The reflective surface 61 serves to reflect the light emitted from the LED unit 3 in a direction perpendicular to the z direction upward in the z direction. The support member 6 having the above-described structure is made by insert molding using a mold. Specifically, the support member 6 is formed by setting the leads 1 and 2 in a mold, pouring liquid epoxy resin into the mold and then hardening the resin. According to this method, liquid epoxy resin flows into the opening 11a, so that the opening 11a is filled with part of the support member 6. When epoxy resin does not flow into the entire portion of the opening 11a and only part of opening 11a is filled with the support member 6, transparent bonding material 4 may be supplied into the opening 11a.

The protective member 7 is formed to fill the region surrounded by the reflective surface 61 and covers the die-bonding portion 11, the wire-bonding portion 21, the LED unit 3 and the wires 51, 52. For instance, the protective member 7 is made of a transparent epoxy resin.

The advantages of the LED module A1 are described below.

According to this embodiment, since the LED unit 3 is mounted on the lead 1 made of a metal, heat generated during light emission of the LED unit 3 is readily transferred to the lead 1. Since the terminal portion 12 of the lead 1 is exposed to the outside of the support member 6, heat transferred to the lead 1 is readily released to the outside air. Thus, the LED module A1 exhibits high heat dissipation performance, and hence deterioration of the LED unit 3 due to temperature rise is prevented, thereby providing enhanced reliability.

Moreover, according to this embodiment, part of the light emitted from the LED unit 3 downward in the z direction is reflected by the white support member 6 filling the opening 11a to travel upward in the z direction. In this way, the presence of the white support member 6 under the LED unit 3 provides a higher reflectivity than when the underside of LED unit 3 is entirely covered by the lead 1 made of a metal. Thus, in the LED module A1, light traveling downward in the z direction is efficiently turned into light traveling upward in the z direction. Thus, the LED module A1 can utilize light from the LED unit 3 with a high efficiency close to the efficiency provided when the LED unit 3 is placed on a white non-metal material, while having high heat dissipation performance due to the use of the metal lead 1.

Figure 3:
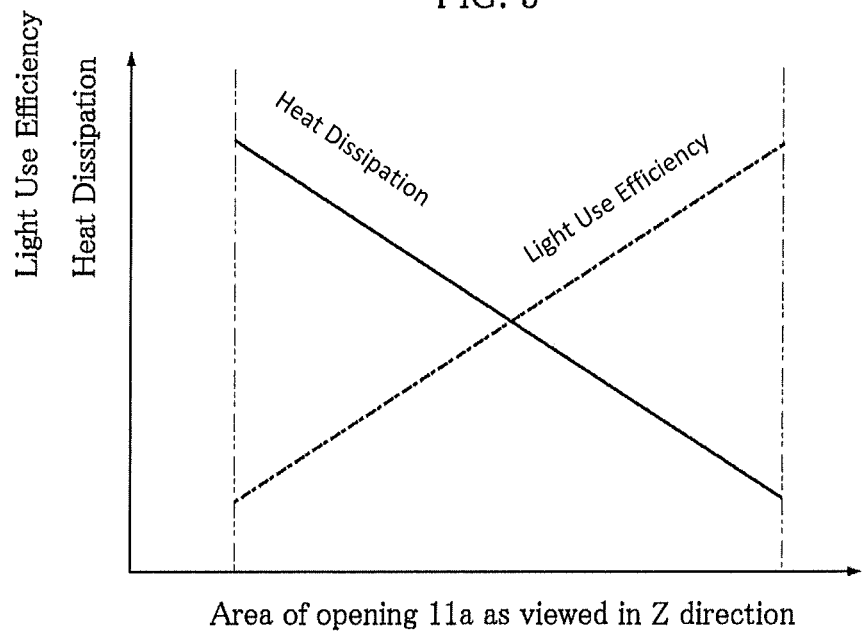
FIG. 3 is a graph showing the relationship between the performance and the area of an opening of the LED module shown in FIG. 1.

FIG. 3 shows the relationship between the area of the opening 11a as viewed in the z direction and the heat dissipation performance of the LED module A1 or use efficiency of the light emitted from the LED unit 3. As shown in FIG. 3, as the area of the opening 11a increases, the use efficiency of light from the LED unit 3 increases, while the heat dissipation performance of the LED module A1 decreases. The area of the opening 11a as viewed in the z direction is determined according to the application of the LED module A1 or the performance of the LED unit 3. In an example in which the area of the opening 11a is smallest, the opening 11a is in the form of a square as viewed in the z direction, with each side of the square corresponding to the thickness of the lead 1. In an example in which the area of the opening 11a is largest, the opening 11a just overlaps the LED unit 3 in the z direction.

Figure 4:
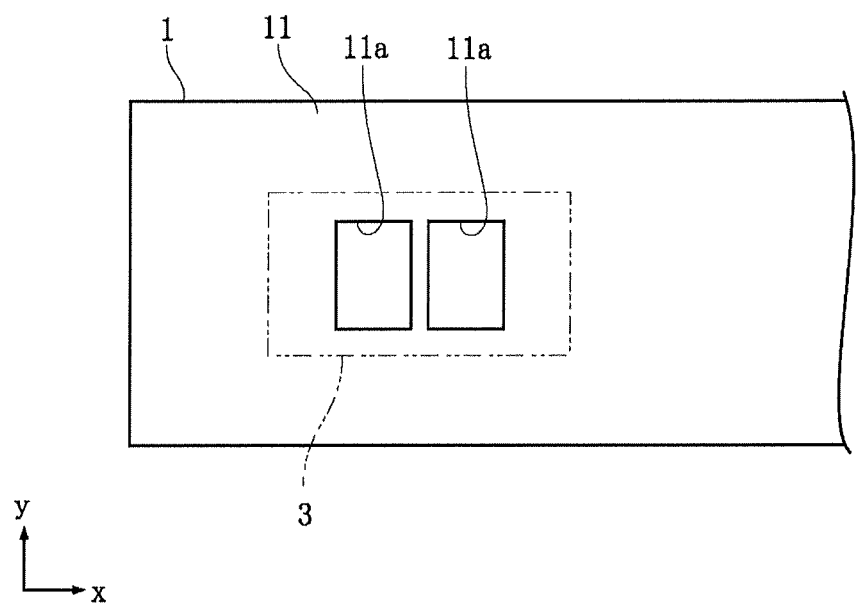
FIG. 4 is an enlarged plan view showing a principal portion of another example of the LED module shown in FIG. 1.

The opening 11a may be divided e.g. as shown in FIG. 4. Moreover, the opening 11a may not be merely divided but may comprise combination of a plurality of through-holes.

Other embodiments of the present invention are described below. In these figures, the elements that are identical or similar to those of the foregoing embodiment are designated by the same reference signs as those used for the foregoing embodiment, and the description is omitted appropriately.

Figure 5:
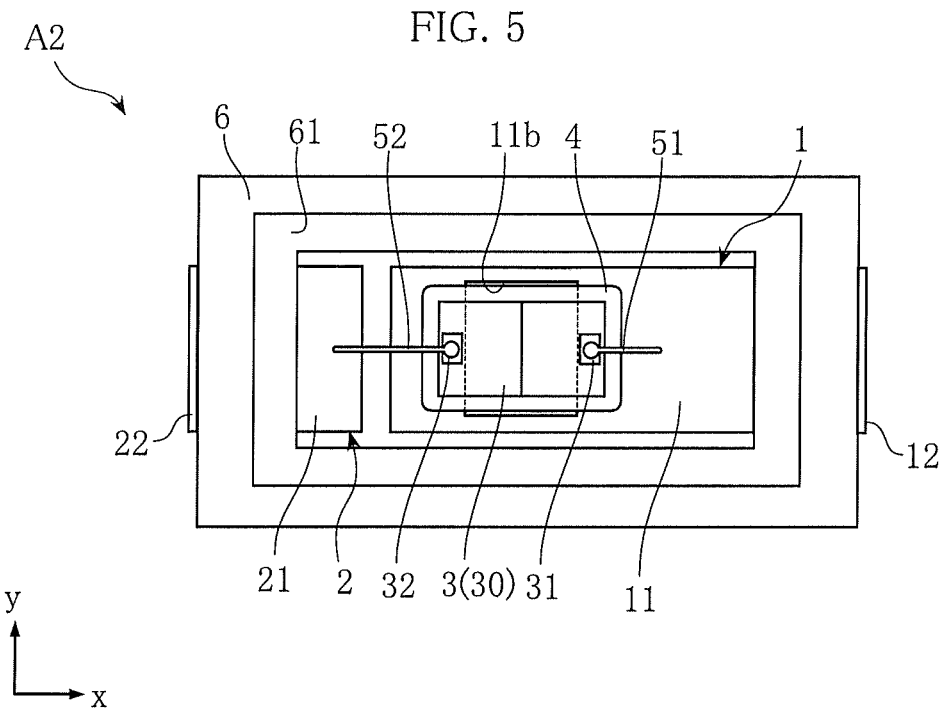
FIG. 5 is a plan view showing an LED module according to a second embodiment of the present invention.

FIG. 5 shows an LED module A2 according to a second embodiment of the present invention. The LED module A2 has a die-bonding portion 11 formed with an opening 11b larger than the opening 11a of the foregoing embodiment. The structures of other parts are the same as those of the LED module A1.

The opening 11b is in the form of a rectangle whose dimension in the y direction is larger than the dimension in the y direction of the LED unit 3. As shown in FIG. 5, in the y direction, the LED unit 3 is flanked by two edges of the opening 11b which are spaced from each other in the y direction. Similarly to the opening 11a, the opening 11b is filled with the support member 6.

In this embodiment, heat generated during light emission of the LED unit 3 is transferred to the die-bonding portion 11 from the two ends of the LED unit 3 which are spaced from each other in the x direction. Thus, the LED module A2 exhibits high heat dissipation performance.

At the two ends of the LED unit 3 which are spaced from each other in the x direction are arranged the electrode terminals 31 and 32. Therefore, from these end portions, light is unlikely to be emitted upward in the z direction. In this embodiment, the underside of the LED unit 3 in the z direction is white almost entirely except the above-described portions from which light is unlikely to be emitted upward in the z direction. Thus, in the LED module A2, light emitted from the LED unit 3 downward in the z direction is turned into light traveling upward in the z direction with an efficiency close to the efficiency provided when the LED unit 92 is placed on a white substrate 91, as is in the conventional LED module X. Thus, the LED module A2 can utilize light from the LED unit 3 with high efficiency, while retaining high heat dissipation performance.

Figure 6:
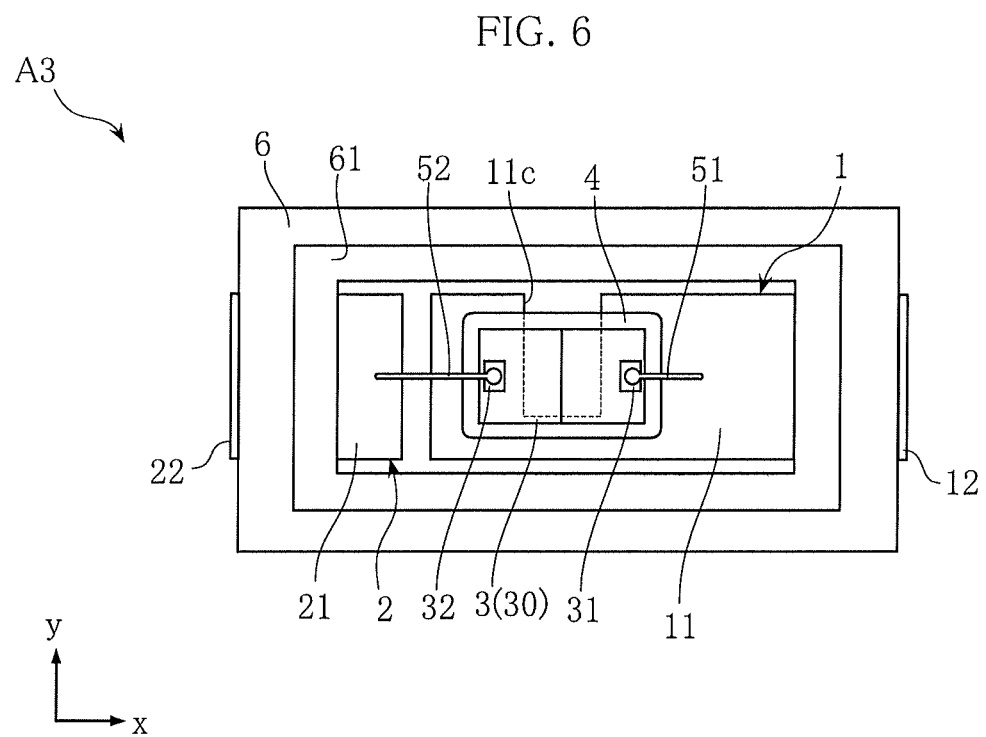
FIG. 6 is a plan view showing an LED module according to a third embodiment of the present invention.

FIG. 6 shows an LED module A3 according to a third embodiment of the present invention. The LED module A3 has a die-bonding portion 11 formed with an opening 11c in the form of a cutout. The structures of other parts are the same as those of the LED module A1.

The opening 11c extends downward from the upper edge of the die-bonding portion 11 in the y direction in FIG. 6. The opening 11c is also filled with the support member 6.

The LED module A3 also exhibits high heat dissipation performance because part of the LED unit 3 is held in contact with the die-bonding portion 11 made of a metal. Further, the white support member 6 filling the opening 11c functions to efficiently turn the light emitted from the LED unit 3 downward in the z direction to light traveling upward in the z direction.

Figure 7:
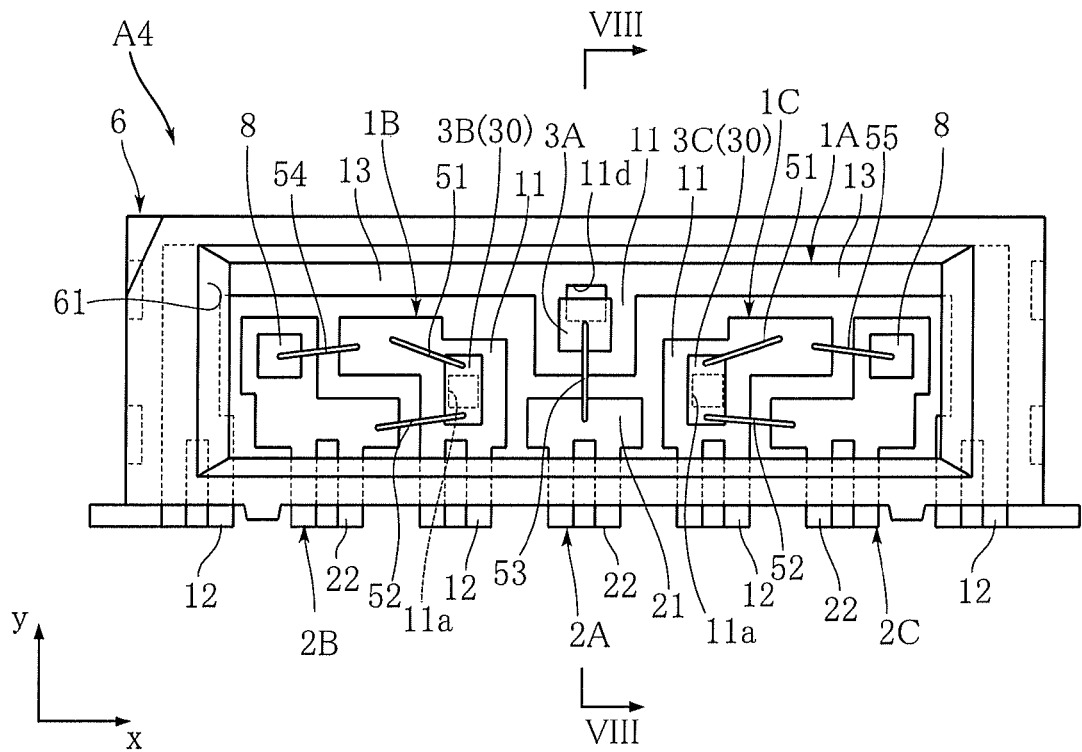
FIG. 7 is a plan view showing an LED module according to a fourth embodiment of the present invention.
Figure 8:
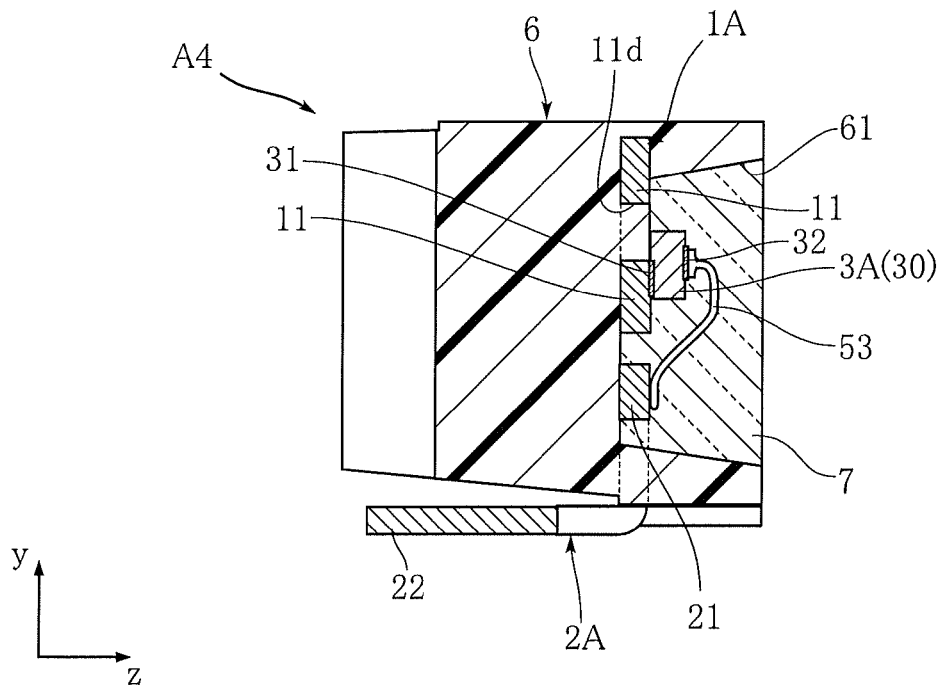
FIG. 8 is a sectional view taken along lines VIII-VIII in FIG. 7.

FIGS. 7 and 8 show an LED module A4 according to a fourth embodiment of the present invention. The LED module A4 includes leads 1A, 1B, 1C, 2A, 2B and 2C, LED units 3A, 3B and 3C, a support member 6, a protective member 7, and two Zener diodes 8. The LED module A4 is configured as a side-view LED module that emits light mainly in the z direction.

The leads 1A, 1B, 1C, 2A, 2B and 2C are made of copper and plated with silver, for example.

The lead 1A includes a die-bonding portion 11, terminal portions 12, and a thin, elongated strip portion 13 connecting the die-bonding portion 11 and the terminal portion 12 to each other. The die-bonding portion 11 has an opening 11d, and the LED unit 3A is bonded to the die-bonding portion by using a bonding material, not shown. The opening 11d is filled with the support member 6.

The LED unit 3A has an electrode terminal 31 at an end surface in the z direction in FIG. 8 and an electrode terminal 32 at another end surface in the z direction in FIG. 8. The electrode terminal 31 is electrically connected to the lead 1A by its contact with the die-bonding portion 11. The electrode terminal 32 is connected to the wire-bonding portion 21 of the lead 2A by a wire 53.

In this embodiment, as shown in FIG. 8, the opening 11d is formed in such a manner as to avoid the electrode terminal 31.

The LED units 3B and 3C mounted on the leads 1B and 1C have the same structure as that of the LED unit 3 of the LED module A1. The LED unit 3B is connected to the lead 1B via a wire 51 and connected to the lead 2B via a wire 52. The LED unit 3C is connected to the lead 1C via a wire 51 and connected to the lead 2C via a wire 52.

The die-bonding portion 11 of each of the leads 1B and 1C has an opening 11a similar to the opening provided in the LED module A1, for example.

In this embodiment, all the terminal portions 12, 22 of the leads 1A, 1B, 1C, 2A, 2B and 2C are exposed to the outside of the support member 6 from the lower side in the y direction in FIG. 7.

The two Zener diodes 8 are mounted on the leads 2B and 2C, respectively, and connected to the leads 1B and 1C via wires 54 and 55. The Zener diodes 8 prevent application of excessive reverse voltage to the LED units 3B and 3C and allow current to flow in a reverse direction only when an excessive reverse voltage above a certain value is applied.

The LED module A4 also exhibits high heat dissipation performance because the LED units 3A, 3B and 3C are mounted on the leads 1A, 1B and 1C made of a metal. Further, the light emitted from the LED units 3A, 3B and 3C toward one side in the z direction is efficiently reflected toward the other side in the z direction by the white support member 6 filling the openings 11a and 11d formed in the leads 1A, 1B and 1C.

Figure 9:
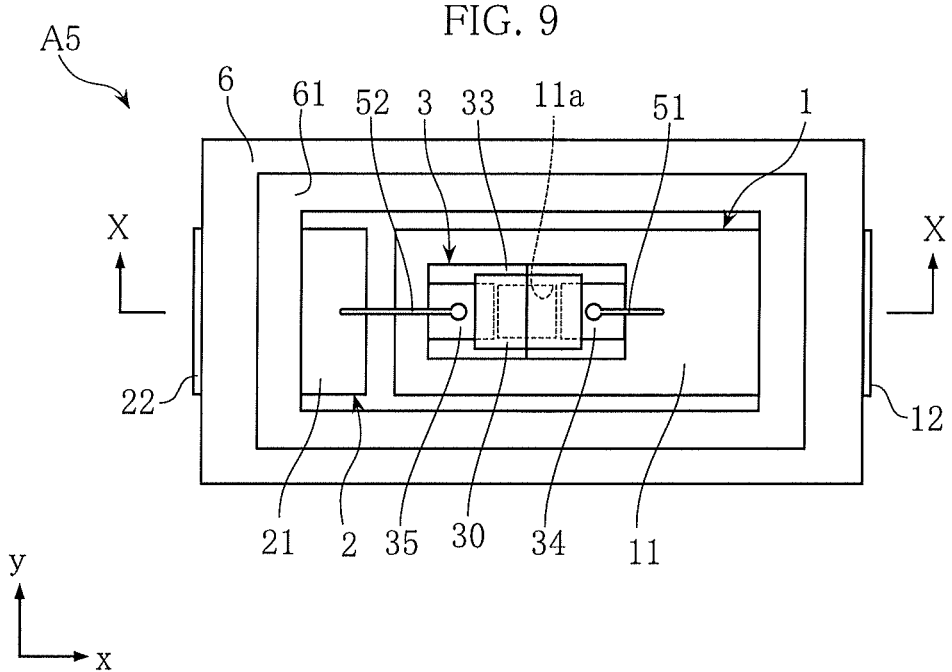
FIG. 9 is a plan view showing an LED module according to a fifth embodiment of the present invention.
Figure 10:
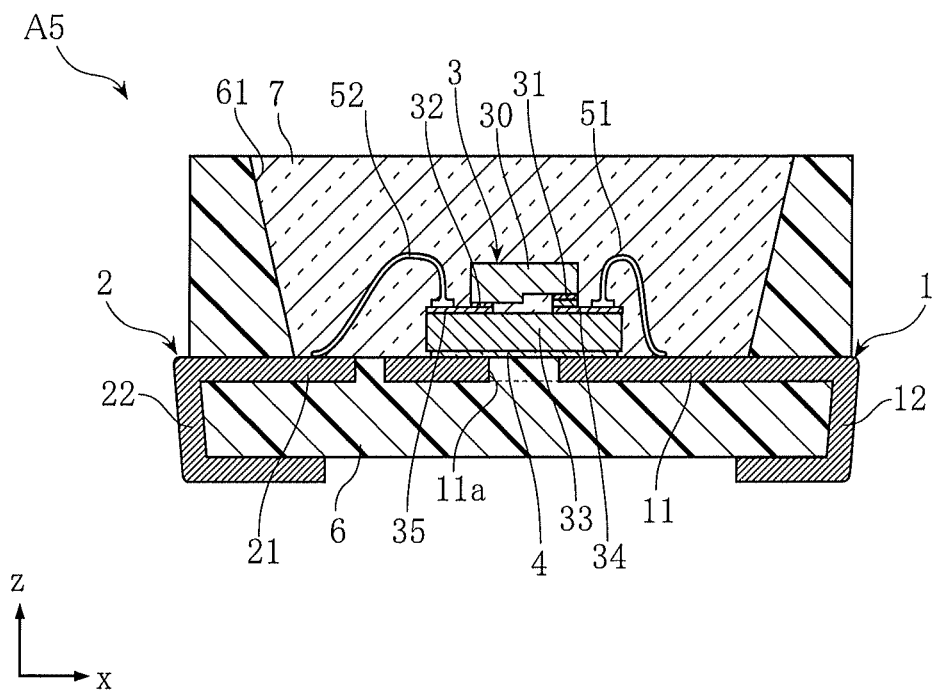
FIG. 10 is a sectional view taken along lines X-X in FIG. 9.

FIGS. 9 and 10 show an LED module according to a fifth embodiment of the present invention. The LED module A5 of this embodiment differs from the LED module A1 in structure of the LED unit 3. In this embodiment, the LED unit 3 includes an LED chip 30 and a sub-mount substrate 33 supporting the LED chip.

The LED chip 30 is made by forming a layer of a semiconductor material such as gallium nitride on a surface of a substrate made of e.g. sapphire. The LED chip 30 emits blue light, green light, red light or the like due to recombination of electrons and holes in an active layer sandwiched between an n-type semiconductor layer and a p-type semiconductor layer. In the LED chip 30, since the light emitted is hardly absorbed by the sapphire substrate, light is emitted in almost all directions. The LED chip 30 is provided with an electrode terminal 31 electrically connected to the n-type semiconductor layer and an electrode terminal 32 electrically connected to the p-type semiconductor layer. As shown in FIG. 9, the LED chip 30 is so arranged as to include the entirety of the opening 11a, as viewed in the z direction.

The sub-mount substrate 33 is a transparent substrate made of e.g. Si and mounted on the lead 1 by using a transparent bonding material 4. The upper end surface in the direction z is provided with an electrode pad 34 at one end in the x direction and an electrode pad 35 at the other end in the x direction. As shown in FIG. 9, the electrode pads 34 and 35 are formed so as not to overlap the opening 11a as viewed in the z direction. The electrode pad 34 is electrically connected to the die-bonding portion 11 via a wire 51. The electrode pad 35 is electrically connected to the wire-bonding portion 21 via a wire 52.

As shown in FIG. 10, the LED chip 30 is mounted on the sub-mount substrate 33, with the electrode terminal 31 electrically connected to the electrode pad 34 and the electrode terminal 32 electrically connected to the electrode pad 35. The electrode terminals 31 and 32 are bonded to the electrode pads 34 and 35 by e.g. eutectic bonding.

Since the sub-mount substrate 33 is mounted on the lead 1 made of a metal, heat generated during light emission of the LED chip 30 is readily transmitted to the lead 1. Since the terminal portion 12 of the lead 1 is exposed to the outside of the support member 6, heat transferred to the lead 1 is readily released to the outside air. Thus, the LED module A5 exhibits high heat dissipation performance. Further, deterioration due to temperature rise of the LED chip 30 is prevented, so that reliability is enhanced.

Moreover, according to this embodiment, part of the light emitted from the LED chip 30 downward in the z direction passes through the transparent sub-mount substrate 33 and is then reflected by the white support member 6 filling the opening 11a to travel upward in the z direction. In this way, in the LED module A5, light traveling downward in the z direction is efficiently turned into light traveling upward in the z direction. Thus, the LED module A5 can utilize light from the LED chip 30 with a high efficiency close to the efficiency provided when the LED unit 3 is placed on a white non-metal material, while exhibiting high heat dissipation performance by the use of the metal lead 1.

Figure 11:
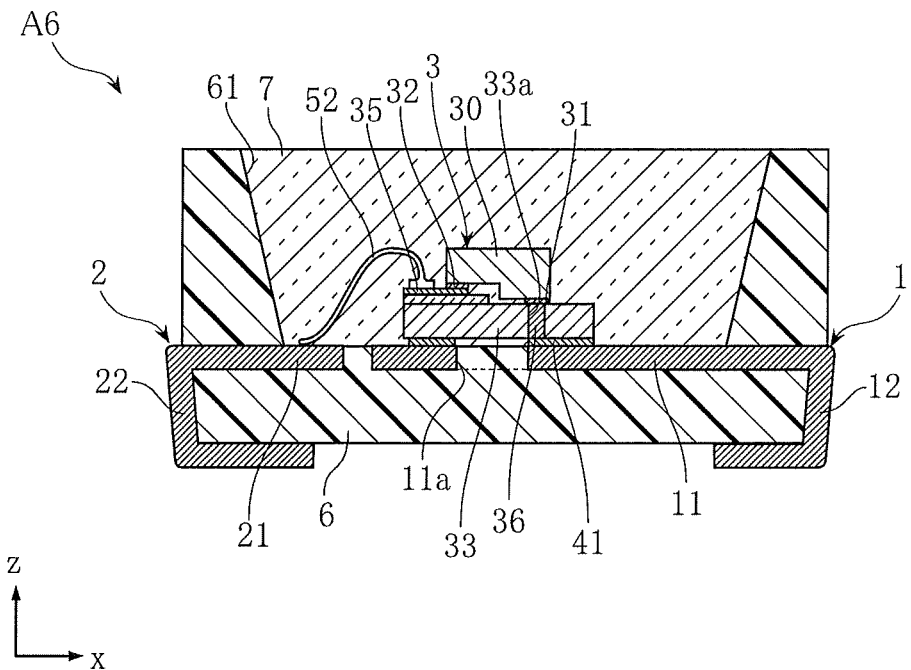
FIG. 11 is a sectional view showing an LED module according to a sixth embodiment the present invention.
Figure 11:
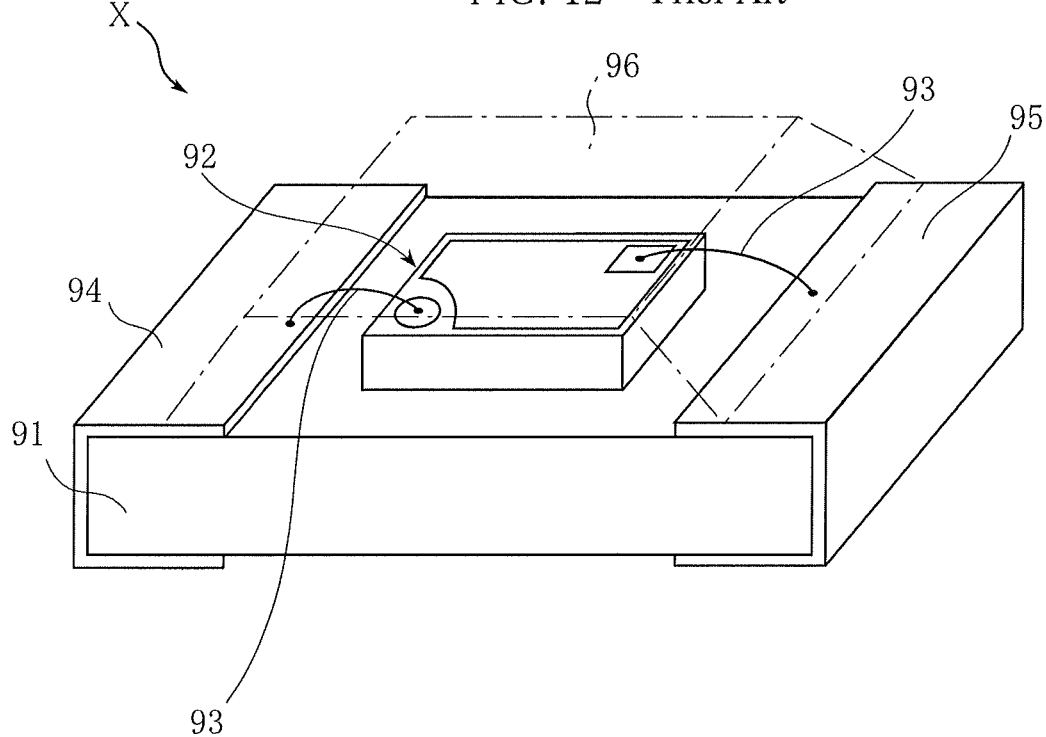

FIG. 11 shows an LED module according to a sixth embodiment of the present invention. The LED module A6 of this embodiment differs from the LED module A5 in the manner in which the LED unit 3 is mounted. The structures of other parts are the same as those of the LED module A5. Further, in this embodiment, the sub-mount substrate 33 is mounted on the lead 1 by using a conductive bonding material 41 such as silver paste.

In this embodiment, the lower end surface of the LED chip 30 in the z direction is provided with an electrode terminal 31, which is electrically connected to the p-type semiconductor layer, at one end in the x direction and an electrode terminal 32, which is electrically connected to the n-type semiconductor layer, at the other end in the x direction.

The sub-mount substrate 33 of this embodiment has a through-hole 33a filled with an electric conductor 36, instead of having an electrode pad 34. The electric conductor 36 is electrically connected to the lead 1 via the bonding material 41. Because of this arrangement, the wire 51 is not provided in this embodiment.

The LED chip 30 of this embodiment is mounted on the sub-mount substrate 33, with the electrode terminal 31 electrically connected to the electric conductor 36 and the electrode terminal 32 electrically connected to the electrode pad 35. The electrode pad 35 and the wire-bonding portion 21 are connected to each other via a wire 52.

As shown in FIG. 11, the bonding material 41 is formed so as not to overlap the opening 11a.

With the LED module A6 again, part of the light emitted from the LED chip 30 downward in the z direction passes through the transparent sub-mount substrate 33 and is then reflected by the white support member 6 filling the opening 11a to travel upward in the z direction. In this way, in the LED module A6, light traveling downward in the z direction is efficiently turned into light traveling upward in the z direction. Thus, the LED module A6 can utilize light from the LED chip 30 with a high efficiency close to the efficiency provided when the LED unit 3 is placed on a white non-metal material, while exhibiting high heat dissipation performance by the use of the metal lead 1.

The LED module of the present invention is not limited to the foregoing embodiments. The specific structure of each part of the LED module according to the present invention can be varied in design in many ways. For instance, e.g. aluminum nitride may be added as a heat dissipating filler to the bonding material 4 of the LED modules A1-A3. Enhancing the heat conductivity of the bonding material 4 promotes heat transfer from the LED unit 3 to the lead 1.

Although the openings 11a, 11b, 11d are rectangular as viewed in the z direction in the foregoing embodiments, the openings may be circular or oval or have other polygonal shape.

Although the leads 1, 2, 1A, 1B, 1C, 2A, 2B and 2C are made of a copper plate plated with silver, other metals may be used to form the leads.

Although the support member 6 is made of a white resin in the foregoing embodiments, an LED module employing a white ceramic substrate similarly to the conventional LED module X also provides the advantages of the present invention.

Although openings 11a are provided in the LED modules A5 and A6, openings similar to the opening 11b of the LED module A2 or similar to the opening 11c of the LED module A3 may be provided.

The invention claimed is:

1. A light-emitting module comprising:
a first lead;
a second lead spaced apart from the first lead;
an LED chip provided with a first electrode terminal and a second electrode terminal, the first electrode terminal being electrically connected to the first lead, the second electrode terminal being electrically connected to the second lead via a wire;

a white support member supporting the first lead and the second lead and having a higher reflectivity than the first lead; and a bonding member for attaching the LED chip to the first lead, the bonding member being transparent with respect to light emitted from the LED chip;

wherein the first lead includes a die-bonding portion having a first surface and a second surface opposite to each other in a thickness direction, the LED chip being mounted on the first surface, the second surface being in contact with the white support member, the die-bonding portion is formed with an opening extending through the die-bonding portion in the thickness direction, the white support member includes a portion disposed within the opening, at least a part of the portion of the white support member disposed within the opening overlaps with a part of the LED chip as viewed in the thickness direction, the LED chip has a first side surface and a second side surface spaced apart from each other in a spacing direction in which the first lead and the second lead are spaced apart from each other, the first side surface being closer to the second lead than is the second side surface, the first lead has an end surface that faces the second lead in the spacing direction, the first side surface of the LED chip is offset from the end surface of the first lead such that the first side surface of the LED chip is positioned farther away from an end surface of the second lead than the end surface of the first lead is positioned from the end surface of the second lead, and the white support member is made of a resin, and the opening is entirely filled with the white support member.

2. The light-emitting module according to claim 1, wherein at least a part of the opening overlaps with a part of the LED chip as viewed in the thickness direction.

3. The light-emitting module according to claim 2, wherein the opening is smaller in size than the LED chip as viewed in the thickness direction so that an entirety of the opening overlaps with the LED chip.

4. The light-emitting module according to claim 2, wherein the opening has a part which does not overlap with the LED chip as viewed in the thickness direction.

5. The light-emitting module according to claim 4, wherein the LED chip includes two sides opposite to each other in the thickness direction, both the first electrode terminal and the second electrode terminal being provided at one of the two sides, and wherein the opening includes two ends spaced apart from each other in a direction perpendicular to a direction in which the wire extends, and one of the two ends does not overlap with the LED chip as viewed in the thickness direction.

6. The light-emitting module according to claim 3, wherein the LED chip includes two sides opposite to each other in the thickness direction, the first electrode terminal being provided at one of the two sides, the second electrode terminal being provided at the other of the two sides.

7. The light-emitting module according to claim 1, wherein the first lead and the second lead include a surface plated with silver.

8. The light-emitting module according to claim 1, wherein the bonding member contains aluminum nitride.

9. The light-emitting module according to claim 1, wherein the LED chip includes a substrate and a semiconductor element provided on the substrate, the substrate being made of a material transparent with respect to light emitted from the semiconductor element, the substrate being attached to the white support member via the bonding member.

10. A light-emitting module comprising:

a first lead;

a second lead spaced apart from the first lead;

an LED chip provided with a first electrode terminal and a second electrode terminal, the first electrode terminal being electrically connected to the first lead, the second electrode terminal being electrically connected to the second lead via a wire;

a white support member supporting the first lead and the second lead and having a higher reflectivity than the first lead; and a bonding member for attaching the LED chip to the first lead, the bonding member being transparent with respect to light emitted from the LED chip;

wherein the first lead includes a die-bonding portion having a first surface and a second surface opposite to each other in a thickness direction, the LED chip being mounted on the first surface, the second surface being in contact with the white support member, the die-bonding portion is formed with an opening extending through the die-bonding portion in the thickness direction, the white support member includes a portion disposed within the opening, at least a part of the portion of the white support member disposed within the opening overlaps with a part of the LED chip as viewed in the thickness direction, the LED chip has a first side surface and a second side surface spaced apart from each other in a spacing direction in which the first lead and the second lead are spaced apart from each other, the first side surface being closer to the second lead than is the second side surface, the first lead has an end surface that faces the second lead in the spacing direction, the first side surface of the LED chip is offset from the end surface of the first lead such that the first side surface of the LED chip is positioned farther away from an end surface of the second lead than the end surface of the first lead is positioned from the end surface of the second lead, at least a part of the opening overlaps with a part of the LED chip as viewed in the thickness direction, and the opening is smaller in size than the LED chip as viewed in the thickness direction so that an entirety of the opening overlaps with the LED chip.

11. The light-emitting module according to claim 10, wherein the LED chip includes two sides opposite to each other in the thickness direction, the first electrode terminal being provided at one of the two sides, the second electrode terminal being provided at the other of the two sides.

* * * * *